US010198424B2

(12) United States Patent
Ogawa

(10) Patent No.: US 10,198,424 B2
(45) Date of Patent: Feb. 5, 2019

(54) SIMULATION SYSTEM, SIMULATION METHOD, AND SIMULATION PROGRAM

(71) Applicant: Integratto Inc., Tokyo (JP)

(72) Inventor: Yasushi Ogawa, Tokyo (JP)

(73) Assignee: Integratto Inc., Tokyo (JP)

( * ) Notice: Subject to any disclaimer, the term of this patent is extended or adjusted under 35 U.S.C. 154(b) by 0 days.

(21) Appl. No.: 15/509,840

(22) PCT Filed: Jul. 15, 2015

(86) PCT No.: PCT/JP2015/070246
§ 371 (c)(1),
(2) Date: Mar. 8, 2017

(87) PCT Pub. No.: WO2016/039011
PCT Pub. Date: Mar. 17, 2016

(65) Prior Publication Data
US 2017/0262424 A1 Sep. 14, 2017

(30) Foreign Application Priority Data

Sep. 9, 2014 (JP) .................................. 2014-183073

(51) Int. Cl.
*G06F 17/11* (2006.01)
*G06F 17/24* (2006.01)
(Continued)

(52) U.S. Cl.
CPC .......... *G06F 17/246* (2013.01); *G06F 3/0482* (2013.01); *G06F 17/11* (2013.01);
(Continued)

(58) Field of Classification Search
CPC .. G06F 17/246; G06F 17/2247; G06F 17/215; G06F 17/30598; G06F 3/0481;
(Continued)

(56) References Cited

U.S. PATENT DOCUMENTS 5,136,690 A * 8/1992 Becker .................... H04L 41/12
345/619
6,023,691 A * 2/2000 Bertrand ............... G06F 17/246
706/2
(Continued)

FOREIGN PATENT DOCUMENTS

JP H07105289 A 4/1995
JP 2003050827 A 2/2003
(Continued)

OTHER PUBLICATIONS

Zack Barresse, "Loop Through all Worksheets in the Active Workbook", Nov. 2010, pp. 1-2 (Year: 2010).*
(Continued)

*Primary Examiner* — Wilson W Tsui
(74) *Attorney, Agent, or Firm* — McDermott Will & Emery LLP

(57) ABSTRACT

In a conventional quantitative plan simulation, it is practically impossible to prepare a spreadsheet-type data input template applicable to all types of plans. Thus, a quantitative plan simulation system is required to handle a plurality of spreadsheets containing variously-formatted data. Therefore, the present invention provides a simulation system, a simulation method and a simulation program which are configured to extract a numerical value, a mathematical formula or other kinds of data necessary for a quantitative plan simulation, based on a relevancy among numerical values and mathematical formulas or other kinds of data in a spreadsheet, and perform the quantitative plan simulation based on the extracted numerical values and mathematical formulas.

13 Claims, 12 Drawing Sheets

(51) Int. Cl.
  *G06Q 10/10* (2012.01)
  *G06F 3/0482* (2013.01)
  *G06F 17/30* (2006.01)
  *G06F 17/50* (2006.01)
  *G06Q 10/06* (2012.01)

(52) U.S. Cl.
  CPC .... *G06F 17/30312* (2013.01); *G06F 17/5009* (2013.01); *G06Q 10/06* (2013.01); *G06Q 10/10* (2013.01)

(58) Field of Classification Search
  CPC .. G06F 3/0482; G06F 17/11; G06F 17/30312; G06F 17/5009; G06Q 10/10; G06Q 10/06
  See application file for complete search history.

(56) References Cited

U.S. PATENT DOCUMENTS

| | | | | |
|---|---|---|---|---|
| 6,271,863 | B1* | 8/2001 | Bose | G06F 3/0481 345/440 |
| 7,120,866 | B2* | 10/2006 | Kotler | G06F 17/211 715/209 |
| 7,305,358 | B1 | 12/2007 | Sekiya | |
| 2004/0194019 | A1* | 9/2004 | Mast | G06F 17/246 715/209 |
| 2006/0212791 | A1 | 9/2006 | Crow et al. | |
| 2007/0033519 | A1* | 2/2007 | Zdenek | G06F 17/215 715/234 |
| 2007/0136666 | A1 | 6/2007 | Khen et al. | |
| 2008/0256432 | A1 | 10/2008 | Sambandam et al. | |
| 2010/0293450 | A1* | 11/2010 | Ratkowski | G06Q 40/00 715/219 |
| 2011/0307874 | A1* | 12/2011 | Messerly | G06F 17/246 717/140 |

FOREIGN PATENT DOCUMENTS

| | | |
|---|---|---|
| JP | 2003067550 A | 3/2003 |
| JP | 2006172024 A | 6/2006 |
| JP | 2006260557 A | 9/2006 |

OTHER PUBLICATIONS

Aseem Kishore, "Word Count in Word 2010", published: May 16, 2012, pp. 1-11 (Year: 2012).*

Official Action of Japanese Patent Appln. No. 2014-183073 dispatched dated Mar. 9, 2015 (translation).

"Enterprise Business Simulation Solution Guide," Integratto, 12 pages, www.integratlo.co.jp (translation of page 8).

Extended European Search Report from European Patent Application No. 15840266.9, dated Mar. 8, 2018, 8 pages.

* cited by examiner

FIG.2
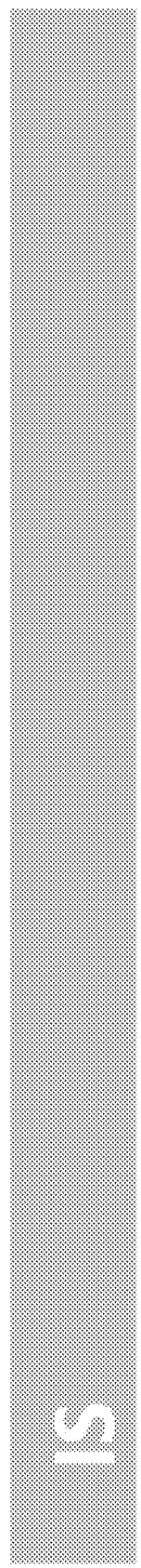
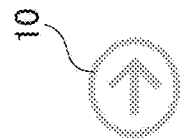

FIG.3

FIG.4
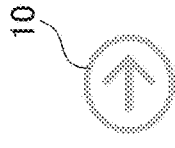
10
File Name : 2014_01_Investment Evaluation Format.xlsm
Number of Sheets : 3
Number of Cells : 1,367
Number of Input Cells : 58
Number of Calculation Cells : 765
Number of Calculation Result Cells : 19
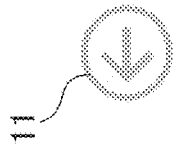
11

FIG.8
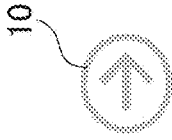
10
104
103
Please input a calculation result,
such as NPV or IRR, to be displayed.
105
106 NPV      Sheet Name: Development Plan, Location: D273
     IRR     Sheet Name: Development Plan, Location: D351
     Payout Time
             Sheet Name: Evaluation Summary, Location: AB5
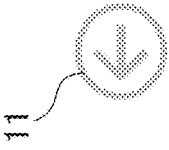
11

SIMULATION SYSTEM, SIMULATION METHOD, AND SIMULATION PROGRAM

TECHNICAL FIELD

The present invention relates to a simulation system, a simulation method and a simulation program for performing a quantitative plan simulation, based on numerical values, mathematical formulas or others input in the form of a spreadsheet, to thereby support decision-making such as management judgment.

BACKGROUND ART

In conventional systems for performing a quantitative plan simulation (e.g., management simulation such as simulation of an investment plan), there is a system configured to allow a user to input numerical values, mathematical formulas or other kinds of data into a tabular-formatted spreadsheet by using general-purpose spreadsheet software (e.g., Microsoft Excel), and perform a quantitative plan simulation based on the spreadsheet.

For example, a management simulation system, method and program described in JP 2003-67550 A (Patent Document 1) are designed to calculate a numerical value serving as a management index or a management factor, based on data or calculation formulas associated with respective cells of a spreadsheet, to readily perform a quantitative plan simulation using general-purpose spreadsheet software without using any special software for management simulation. Further, there has already been a quantitative plan simulation-related system, i.e., a quantitative plan simulation system, configured to realize decision-making utilizing quantitative analysis and simulation based on Microsoft Excel (see Non-Patent Document 1).

In such a quantitative plan simulation, simulating under what conditions and how this plan will change in the future is very important for judgment of feasibility of the plan, determination of an implementation process of the plan, decision whether or not to admit implementation of the plan, and follow-up after start of the plan implementation. During planning as a preparatory stage prior to performing a quantitative plan simulation, it is essential for a user to perform a step of studying a fluctuation range and other conditions for each of the assumptions data as risk factors by himself/herself, and manually inputting a result of the study.

Generally, numerical values and mathematical formulas each necessary for a quantitative plan simulation, such as sales amount, production cost and net profit are accumulated in a database or the like in a spreadsheet (or table) format through a routine work in a company or the like. Thus, a burden of the manual input preparatory for the quantitative plan simulation can be reduced by using a part of the numerical values, mathematical formulas or other kinds of data preliminarily accumulated in a spreadsheet format, as various assumption data (see, for example, in JP 2003-67550 A (Patent Document 1)). Further, in a company or the like, there are some cases where a simplified simulation is performed using general-purpose spreadsheet software. In these cases, a spreadsheet used for the simulation can be reused so as to reduce the burden of the manual input preparatory for the quantitative plan simulation.

CITATION LIST

Patent Document

JP 2003-67550 A

Non-Patent Document

Non-Patent Document 1: "Enterprise Business Simulation Solution Guide", Integratto Inc., Nov. 19, 2013, [Search: Sep. 9, 2014], Internet (URL:http://ds.integratto.co.jp/download/files/data/EBS_SolutionGuide.pdf)

SUMMARY OF INVENTION

Technical Problem

However, in a conventional quantitative plan simulation, it is practically impossible to preliminarily prepare a spreadsheet-type data input template applicable to all types of plans, so that the number of pieces of data to be input into a spreadsheet according to contents of different plans and an input position (position of an input cell) of each data piece will vary for each plan. Therefore, a quantitative plan simulation system is required to handle a plurality of spreadsheets containing variously-formatted data.

Moreover, there is a possibility that data contained in a spreadsheet includes a large number of data pieces which are not directly related to the quantitative plan simulation. Thus, it is not efficient that a user or the like manually selects, from such a large amount of data, specific data pieces necessary for setting the assumption data as risk factors during preparation for the quantitative plan simulation, i.e., index data such as a numerical values, mathematical formula or other kinds of data. Further, it is extremely difficult for an ordinary user to perform the manual work of selecting necessary ones of the numerical values, the mathematical formulas of other data, because the manual work requires expert knowledge such as knowledge about a relevancy among the numerical values, and a meaning of each of the mathematical formulas. Such difficulty in the selection work is likely to become a factor causing omission of the setting of the assumption data, resulting in deteriorated accuracy of the quantitative plan simulation.

Therefore, there is a need for realizing a quantitative plan simulation capable of cutting out user's time and effort for setting of the assumption data, for example, capable of, only by a click operation (or by "one click"), without modifying those assumption data for a business plan on Microsoft Excel spreadsheet preliminarily created by a user, causing an entirety of a book comprising one or more spreadsheets to be automatically read and further causing the assumption data to be automatically set, thereby allowing the user to promptly perform simulations for sensitivity analysis and risk analysis and alike.

With a view to solving the above technical problem, the present invention provides a simulation system, a simulation method and a simulation program which are configured to extract numerical values, mathematical formulas or other kinds of data necessary for a quantitative plan simulation, based on a relevancy such as a reference relationship among the numerical values, the mathematical formulas and other data in a spreadsheet, and performing the quantitative plan simulation based on the extracted numerical values and mathematical formulas.

Solution to Technical Problem

In one embodiment of the present invention, there is provided a simulation system configured to repeat the steps of: reading a file comprising one or more spreadsheets each having a plurality of cells, each of at least a part of the cells containing one of a numerical value and a mathematical formula each capable of serving as an index for a quantitative plan simulation; selecting one of the one or more spreadsheets from the file; scanning the cells in the selected spreadsheet; and identifying respective contents of the scanned cells, until there is no longer any spreadsheet selectable from the file, to thereby exhaustively scan all of the cells in the one or more spreadsheets, wherein, in the step of identifying respective contents of the scanned cells, the simulation system is operable, when the content of the scanned cell is a numerical value, and the numerical value is used in calculation, to identify the scanned cell as an assumption data cell and then store the numerical value, and further operable, when the content of the scanned cell is a mathematical formula, and the mathematical formula is not used in any additional calculation, to identify the scanned cell as a calculation result cell and then store the mathematical formula, and, when the content of the scanned cell is a mathematical formula, and the mathematical formula is used in an additional calculation, to identify the scanned cell as a calculation cell and then store the mathematical formula, and wherein the numerical values and the mathematical formulas are associated with respective pieces of information indicative of the corresponding cells each identified as any one of the assumption data cell, the calculation result cell and the calculation cell, and formed as a data set based on a reference relationship among the cells, and the data set is stored in a data base, together with respective names representing the numerical values and the mathematical formulas.

In one embodiment, the simulation system of the present invention is operable, based on the scanning of the cells in the selected spreadsheet, to count at least one of the number of scanned spreadsheets, the number of scanned cells, the number of scanned assumption data cells, the number of scanned calculation cells and the number of scanned calculation result cells, and to sequentially display the resulting counted numbers.

In another embodiment, the simulation system of the present invention is operable to graphically form and display a calculation structure composed of the numerical values and the mathematical formulas contained in the data set stored in the database, in a tree shape.

In yet another embodiment, the simulation system of the present invention is operable, based on the names of the numerical values and the mathematical formulas contained in the data set stored in the database, to display, as a list of one or more candidate names, a list of respective names of one or more indexes each capable of serving as a goal of the quantitative plan simulation, on a selection screen for allowing a user to select the goal.

In still another embodiment of the present invention, the above simulation system is operable, when one of the one or more candidate names is selected as the goal, to: extract, from the database, the data set which contains the calculation result cell corresponding to the selected goal; read, as one or more assumptions, the contents of the one or more assumption data cells or calculation cells contained in the extracted data set; and display a list of the one or more thus read assumptions on an assumption adjustment screen, together with a slide bar for adjusting a value of each of the one or more assumptions.

In yet still another embodiment of the present invention, in the above simulation system, the quantitative plan simulation is continuously run, and the value of each of the one or more assumptions is changed according to sliding of the slide bar, wherein the simulation system is operable to give a changed value of the assumption to the quantitative plan simulation being continuously run, as an input, to thereby obtain a result of the quantitative plan simulation in real time.

In another further embodiment of the present invention, the above simulation system is operable, when one of the one or more assumptions is selected, to insert a detailed information display screen for presenting related information regarding the selected assumption, between an item of the selected assumption and an item of another assumption located just below the item of the selected assumption, in the displayed list.

Effect of Invention

The quantitative plan simulation system of the present invention is configured to exhaustively scan the cells in each of the one or more spreadsheets to identify a numerical value and a mathematical formula for use in formula-based calculation, so that it becomes possible to handle a plurality of spreadsheets containing variously-formatted data, without depending on the number of pieces of data such as numerical values, mathematical formulas or other kinds of data and an input position of each data piece in the spreadsheet.

The quantitative plan simulation system of the present invention is capable of sequentially scanning the cells in each of the one or more spreadsheets to thereby identify all numerical values and mathematical formulas each capable of serving as an index necessary for the quantitative plan simulation, so that it becomes possible to eliminate omission of setting of assumption data as risk factors. This makes it possible to prevent deterioration in accuracy of the quantitative plan simulation.

In addition, it becomes possible to cut out user's time and effort for setting of assumption data, for example, to, only by a click operation (or by "one click"), without modifying assumption data for a business plan on Microsoft Excel spreadsheet preliminarily created by a user, cause an entirety of a book comprising one or more spreadsheets to be automatically read and further cause assumption data to be automatically set, thereby allowing the user to promptly perform simulations for sensitivity analysis and risk analysis.

BRIEF DESCRIPTION OF DRAWINGS

FIG. 2 is a diagram depicting an input screen to be displayed on a terminal of a quantitative plan simulation system.

FIG. 3 is a diagram depicting a confirmation screen for confirming a read file content.

FIG. 4 is a diagram depicting a scan result display screen for displaying a result obtained by scanning a plurality of spreadsheets contained in a file.

FIG. 8 is a diagram depicting a selection screen for selecting a goal (target) of a quantitative plan simulation.

DESCRIPTION OF EMBODIMENTS

With reference to the drawings, one embodiment of the present invention will now be described. In all figures for illustrating the embodiment, the same element or component is basically assigned with the same reference sign, and its repetitive description will be omitted.

Figure 1:
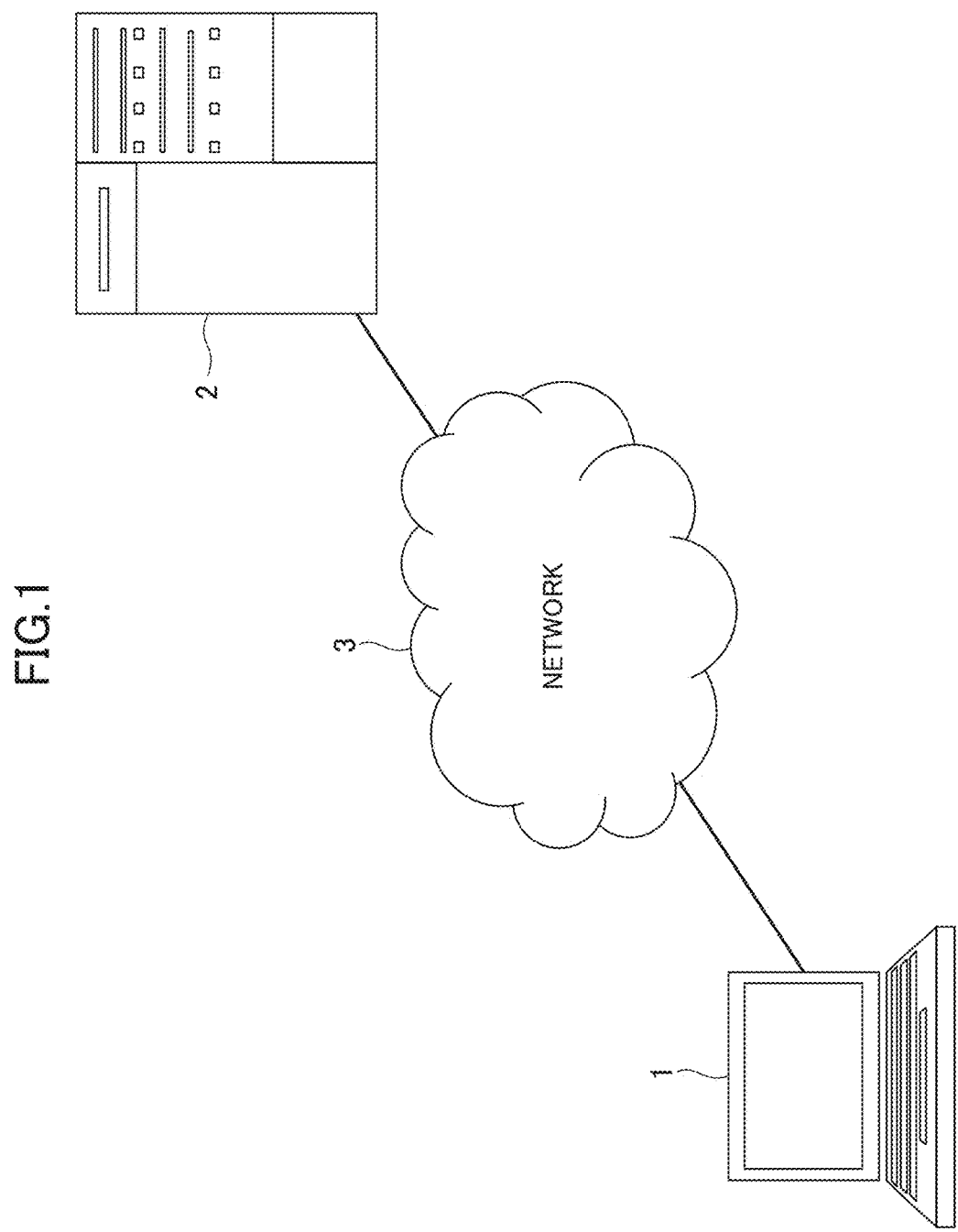
FIG. 1 is a diagram depicting one example of a system configuration realizing a quantitative plan simulation, according to one embodiment of the present invention.

FIG. 1 is a diagram depicting one example of a system configuration realizing a quantitative plan simulation, according to one embodiment of the present invention. The quantitative plan simulation system according to the embodiment depicted in FIG. 1 comprises a terminal 1 which is operated by a user so as to perform a quantitative plan simulation, and a server 2 connected to the terminal 1 via a network 3. The terminal 1 is operable to upload a file comprising one or more spreadsheets, from an input screen displayed on a Web browser or the like to the server 2, and then the server 2 is operable to extract, from among numerical values, mathematical formulas or other kinds of data contained in cells in the one or more spreadsheets, a numerical value and a mathematical formula necessary for a quantitative plan simulation, and perform the quantitative plan simulation based on sensitivity analysis, risk analysis or the like. The terminal 1 is operable to receive a result of the quantitative plan simulation from the server 2, and display the received result on a Web browser or the like.

Each of the terminal 1 and the server 2 comprises a hardware resource of a commonly-used computer, such as a processor, a memory and a hard disc. As one example, the terminal 1 comprises: a network interface for controlling communications with respect to the server 2; a memory storing therein a program for performing a quantitative plan simulation; a processor functioning as a means to executing the program to realize the quantitative plan simulation; a storage device, such as a hard disc, for storing therein a variety of data, such as intermediate data during a quantitative plan simulation and data about a result of the quantitative plan simulation; an input device for inputting various inputs (input data) necessary for a quantitative plan simulation; and a display device for displaying a variety of data, such as an intermediate result and a final result of a quantitative plan simulation. The server 2 may also comprise the same computer hardware resources as those in the terminal 1.

In the quantitative plan simulation system according to the embodiment depicted in FIG. 1, the terminal 1 is operable to execute a program for primarily performing input-output processing for the quantitative plan simulation system, and the server 2 is operable to execute a program for performing major processing of the quantitative plan simulation. As one example, the terminal 1 is operable to perform processing of: transmitting, to the server 2, input data such as a name of a file to be uploaded to the server 2 or assumptions necessary for a quantitative plan simulation; receiving output data such as a processing result, from the server 2; and displaying the received output data on a display screen such as a Web browser. The server 2 is operable to perform a quantitative plan simulation based on the input data received from the terminal 1, via the network 3 such as a public line or a dedicated line.

As above, the terminal 1 and the server 2 in the quantitative plan simulation system function to fulfill their roles, individually. As another embodiment, it is possible to perform the entire processing for the quantitative plan simulation system in only one of the terminal 1 and the server 2. As one example, the terminal 1 may execute a program configured to be capable of realizing a quantitative plan simulation in a stand-alone manner without using the network 3. In this case, the terminal 1 can realize the quantitative plan simulation by itself. In the same manner, the server 2 can realize a quantitative plan simulation by itself.

FIG. 2 is a diagram depicting an input screen to be displayed on the quantitative plan simulation system according to this embodiment. As one example, the input screen may be displayed on the display device (e.g., monitor) of the terminal 1 via Web browser. A user who operates the terminal 1 can designate an address (URL) of the quantitative plan simulation system using the Web browser, to thereby display an input screen as depicted in FIG. 2 on the terminal 2. In the embodiment depicted in FIG. 1, by designating an address (URL) for accessing the server 2, the input screen as depicted in FIG. 2 can be displayed on the Web browser of the terminal 1. In another embodiment where the terminal 1 operates as the quantitative plan simulation system in stand-alone mode, the user may designate an address (URL) for accessing the system in the terminal 1.

Together with a location (path) of a file comprising a spreadsheet of spreadsheet software such as Microsoft Excel, the user inputs a file name into an input field 100 of the input screen. Then, the terminal 1 is operable to access the file designated by the input file name to read a content of the file, and upload the content to the server 2 via the network 3. In another embodiment where the terminal 1 serves as the quantitative plan simulation system by itself, the terminal 1 is operable to simply read the content of the designated file without performing the uploading.

Figure 3:
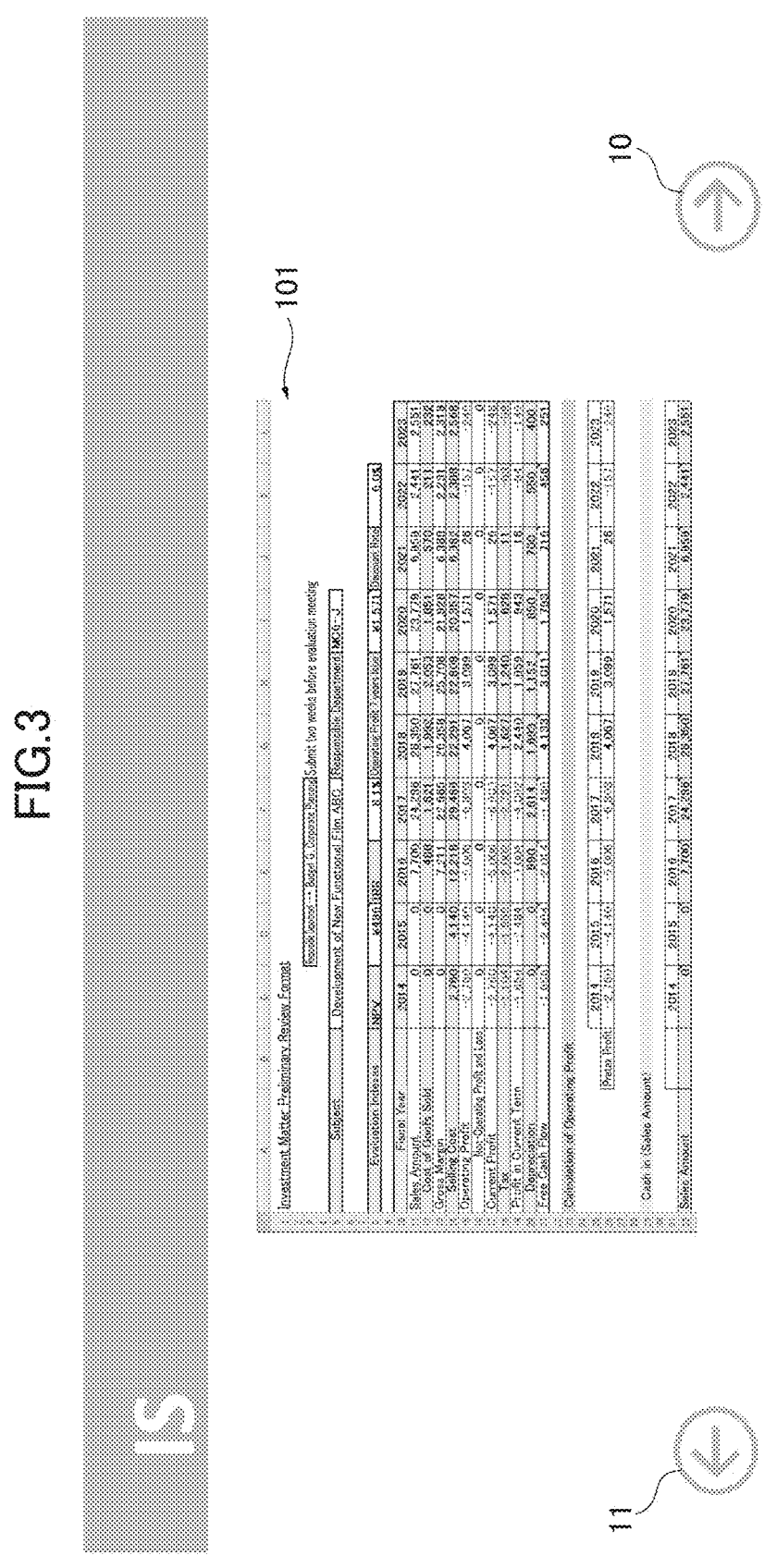

The forward arrow 10 functions as a button for causing a current screen to shift to the next screen, when clicked by the input device such as a mouse. When the user designates a file name in the form of an absolute path by inputting it into the input field 100, and then clicks the forward arrow 10 by the input device such as a mouse, the terminal 1 is operable, in response to the click, to display a confirmation screen as depicted in FIG. 3, on the Web browser, to prompt the user to confirm the file content. It is to be understood that the terminal 1 may be configured to perform the uploading in the background while displaying the confirmation screen as depicted in FIG. 3.

FIG. 3 is a diagram depicting the confirmation screen for confirming the content of the read file, in the quantitative plan simulation system according to this embodiment. The confirmation screen displayed on the Web browser by the display device (e.g., monitor) of the terminal 1 presents a spreadsheet contained in the read file. Thus, the user can confirm the content of the file designated by the input screen depicted in FIG. 2.

The backward arrow 11 functions as a button for causing a current screen to return to the previous screen, when clicked by the input device such as a mouse. Specifically, in the case where the file content displayed on the confirmation screen is not a desired one, the user can click the rearward arrow 11 to cause the confirmation screen displayed on the Web browser of the terminal 1 as depicted in FIG. 3 to return to the input screen depicted in FIG. 2, and then input a file name again. The terminal 1 is operable to accept the input of the new file name from the user, and read one or more spreadsheets comprised in the file.

When the user clicks the forward arrow 10 on the confirmation screen depicted in FIG. 3 by the input device such as a mouse, the terminal 1 is operable, in response to the clicking, to upload the file to the server 2, and the server 2 is operable to scan the one or more spreadsheets comprised in the uploaded file. Further, the terminal 1 is operable to display a scan result screen depicted in FIG. 4, on the Web browser. In another embodiment where the terminal 1 serves as the quantitative plan simulation system by itself, the above processing performed by the server 2 is entirely performed by the terminal 1.

FIG. 4 is a diagram depicting a scan result display screen for displaying a result obtained by scanning a plurality of spreadsheets contained in a file. For example, in a result display field 102 of the scan result display screen, a scan result, such as a file name, the number of sheets, the number of cells, the number of input cells (assumption data cells), the number of calculation cells, and the number of calculation result cells, is displayed. The terminal 1 is operable to receive a scan result from the server 2, and display the received scan result on the Web browser. The server 2 is operable to sequentially transmit a scan result to the terminal 1, and the terminal 1 is operable to sequentially receive the transmitted scan result and update the items of the result display field 102 in real time, according to the scan result. For example, the terminal 1 may be configured to update the result display field 102 of the scan result display screen in such a manner as to count the number of cells scanned in the server 2. In this case, the user can confirm a status of scanning of the file.

When the user clicks the forward arrow 10 in the confirmation screen depicted in FIG. 4 by the input device such as a mouse, the terminal 1 is operable, in response to the clicking, to display a selection screen depicted in FIG. 8, on the Web browser.

Figure 5:
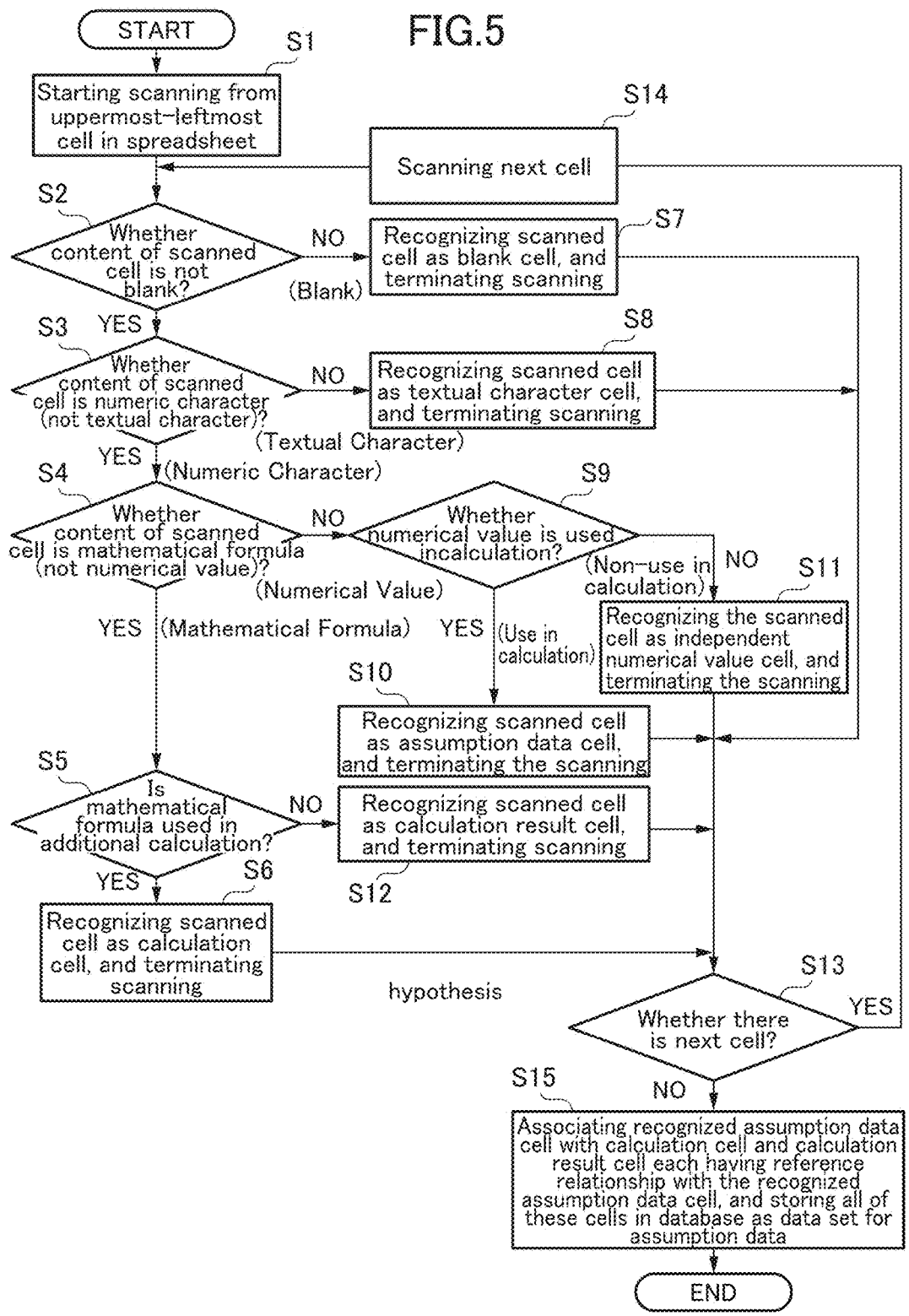
FIG. 5 is a flowchart depicting a flow of processing for scanning cells in a spreadsheet to identify and store all numerical values and mathematical formulas usable in a quantitative plan simulation.

FIG. 5 is a flowchart depicting a flow of processing for scanning cells in a spreadsheet to identify and store all numerical values and mathematical formulas usable in a quantitative plan simulation. In the quantitative plan simulation system according to this embodiment depicted in FIG. 1, a quantitative plan simulation program is executed by the processor of the server 2 so as to enable the server 2 to perform the processing depicted in FIG. 5. In another embodiment where the terminal 1 functions as the quantitative plan simulation system by itself, the terminal 1 is operable to perform the processing depicted in FIG. 5.

For example, in Microsoft Excel, a book-type file (hereinafter referred to simply as "book") comprises one or more spreadsheets. The processing depicted in FIG. 5 is designed to repeat the steps of: selecting one of the one or more spreadsheets comprised in the book; scanning a plurality of cells in the selected spreadsheet; and identifying respective contents of the scanned cells, until there is no longer any spreadsheet selectable from the book, to thereby exhaustively scan all of the cells in the one or more spreadsheets contained in the book.

In step S1, scanning is started from a cell located at a scan start position, e.g., an uppermost and leftmost position of the selected spreadsheet. Specifically, the scanning of the cells means read-in of data such as a numerical value, a mathematical formula, a textual character and a blank, as a content of the scanned cell.

In step S2, it is determined whether the content of the scanned cell is not blank. When the content of the scanned cell is not blank (S2: YES), the processing routine proceeds to step S3. On the other hand, when the content of the scanned cell is blank (S2: NO), the processing routine proceeds to step S7. In the step S7, the scanned cell is recognized as a blank cell, and the scanning is terminated.

In the step S3, it is determined whether or not the content of the scanned cell is a numeric character. When the content of the scanned cell is a numeric character (S3: YES), the processing routine proceeds to step S4. On the other hand, when the content of the scanned cell is not a numeric character but merely a textual character (S3: NO), the processing routine proceeds to step S8. In the step S8, the scanned cell is recognized as a textual character cell, and the scanning is terminated.

In the step S4, it is determined whether the content of the scanned cell is a mathematical formula or a numerical value. When the content of the scanned cell is a mathematical formula (S4: YES), the processing routine proceeds to step S5. On the other hand, when the content of the scanned cell is not a mathematical formula but a numerical value (S4: NO), the processing routine proceeds to step S9.

In the step S5, it is determined whether the content of the scanned cell determined as a mathematical formula is used in an additional calculation. When the mathematical formulas is referenced by other mathematical formulas (S5: YES), the processing routine proceeds to step S6. In the step S6, the scanned cell is recognized as a calculation cell, and the scanning is terminated. On the other hand, when the mathematical formulas is not referenced by any other mathematical formulas (S5: NO), the processing routine proceeds to step S12. In the step S12, the scanned cell is recognized as a calculation result cell, and the scanning is terminated.

In the step S9, it is determined whether or not the content of the scanned cell determined as a numerical value is used in calculation. When the numerical value is referenced by mathematical formulas (S9: YES), the processing routine proceeds to step S10. In the step S10, the scanned cell is recognized as an assumption data cell, and the scanning is terminated. On the other hand, when the numerical value is not referenced by any mathematical formula (S9: NO), the processing routine proceeds to step S11. In the step S11, the scanned cell is recognized as an independent numerical value cell, and the scanning is terminated.

After completion of determination on the content of the one scanned cell (termination of scanning for the one scanned cell), in step S13, it is determined whether or not there is a next cell (e.g., a cell located on a right side of the scanned cell) in the spreadsheet. (In this determination, when there is no longer any scannable cell in the spreadsheet, and there is an additional spreadsheet selectable from the book, the additional spreadsheet is selected, and a cell located at a scan start position e.g., an uppermost and leftmost position of the selected spreadsheet, is determined as a next scannable cell). When there is a next scannable cell (S13: YES), the processing routine proceeds to step S14. In the step S14, scanning for the next cell is started. On the other hand, when there is no longer any scannable cell (S13: NO), the processing routine proceeds to step S15. In the step S15, the thus recognized assumption data cells, calculation result cells and calculation cells are associated with each other based on a reference relationship among numerical values and mathematical formulas corresponding thereto, so as to form a data set for assumption data, and the data set is stored in a database (e.g., the storage device of the server 2) of the quantitative plan simulation system, together with respective names representing the numerical values and the mathematical formulas.

For example, a data set is formed by associating the recognized assumption data cells with the calculation cells and calculation result cells having a reference relationship with the assumption data cells. Then, a textual character cell or a function identifier of a mathematical formula located adjacent to each of the assumption data cells, the calculation cells and the calculation result cells in the data set (e.g., located at an end, such as an upper end or a lower end, of a table in a spreadsheet) is automatically associated with a respective one of the cells as a name thereof. Alternatively, such a textual character cell or a function identifier of a mathematical formula is presented to a user as a candidate for a name of each of the assumption data cells, the calculation cells and the calculation result cells, and then associated with a respective one of the cells as a name thereof by the user. Finally, the data set comprising the assumption data cells, the calculation cells and the calculation result cells each associated with a name thereof is stored in the database. Thus, the data set stored in the database can be searched by each of the names of the cells comprised in the data set. Further, information such as a name of each of the spreadsheets and a position of each of the cells may be stored in the database in combination therewith. Upon completion of the storage in the database in the step S15, the processing for scanning cells in the spreadsheets is terminated.

Figure 6:
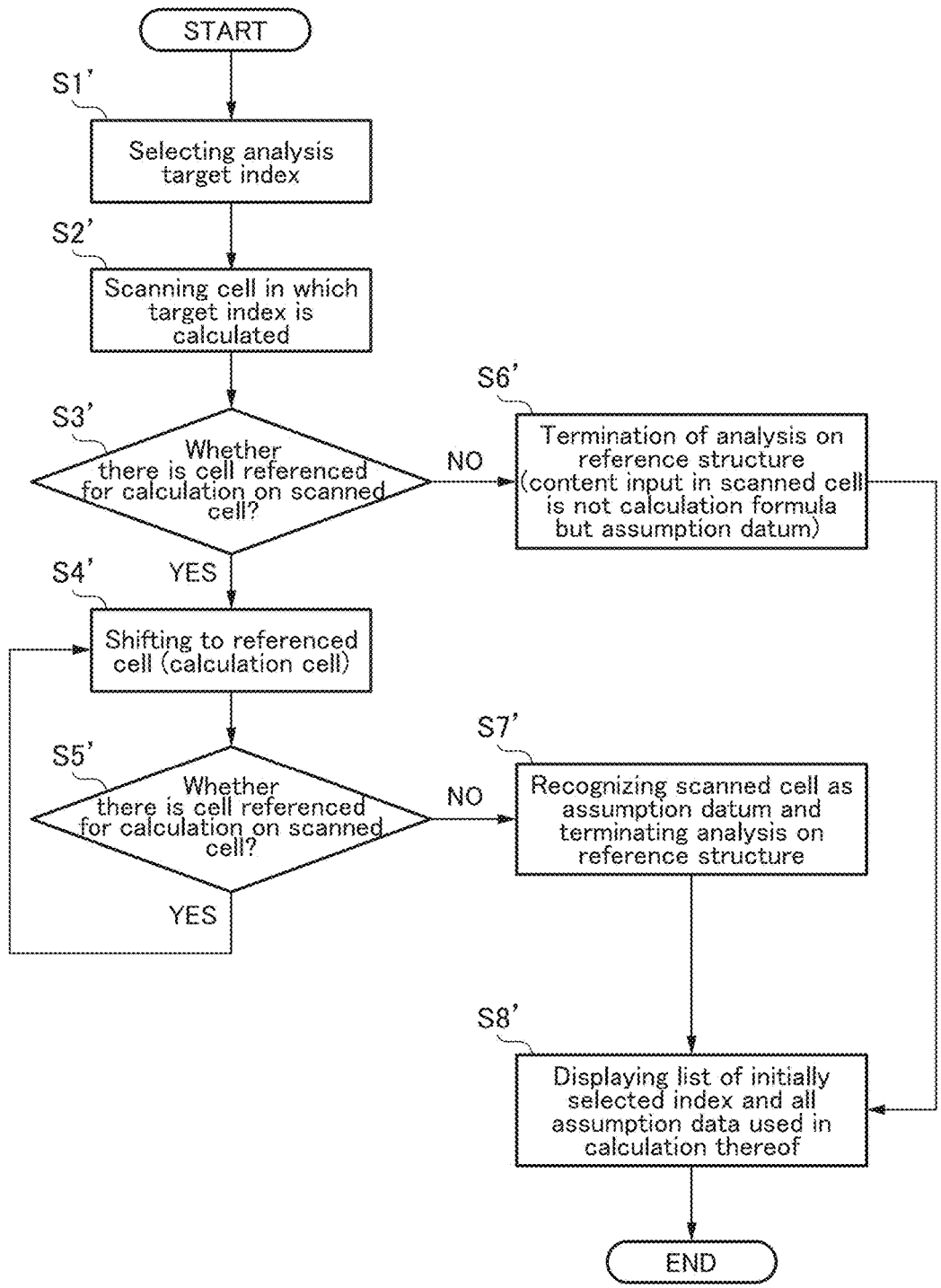
FIG. 6 is a flowchart depicting a flow of processing for scanning cells in a spreadsheet to identify and store numerical values and mathematical formulas pertaining to an analysis target index, individually.

FIG. 6 is a flowchart depicting a flow of processing for scanning cells in a spreadsheet to identify and store numerical values and mathematical formulas pertaining to an analysis target index, individually. In the quantitative plan simulation system according to this embodiment depicted in FIG. 1, the quantitative plan simulation program is executed by the processor of the server 2 so as to enable the server 2 to perform the processing depicted in FIG. 5. In another embodiment where the terminal 1 functions as the quantitative plan simulation system by itself, the terminal 1 is operable to perform the processing depicted in FIG. 6.

In step S1', upon selecting an analysis target index according to a user input, the processing routine proceeds to step S2'. In the step S2', a cell is scanned in which the selected index is calculated. For example, a cell containing a function identifier corresponding to the selected index is searched from one or more spreadsheets comprised in a book, and a cell containing a numerical value or a mathematical formula having a reference relationship with the searched cell is scanned. Alternatively, a cell containing a text corresponding to the selected index is searched from one or more spreadsheets comprised in a book, and a cell containing a mathematical formula or a numerical value pertaining to the text is scanned.

In step S3', as regards the cell scanned in the step S2', it is determined whether or not there is a cell referenced for calculation on the scanned cell. In other words, it is determined whether or not there is a cell containing a numerical value or a mathematical formula referring to the scanned cell. When, as regards the cell scanned in the step S2', there is a cell referenced by the scanned cell (S3': YES), the processing routine proceeds to step S4'. In the step S4', a scan target is shifted to the referenced cell (calculation cell) to scan the cell. On the other hand, when, as regards the cell scanned in the step S2', there is no cell referring to the scanned cell (S3': NO), the processing routine proceeds to step S6'. In the step S6', a content input in the cell is recognized as assumption datum, not as a calculation formula, and the analysis on the reference structure of the analysis target index is terminated.

In step S5', as regards the cell scanned in the step S4', it is determined whether or not there is a cell referenced for calculation on the scanned cell. When there is a referenced cell (S5': YES), the processing routine returns to the step S4'. In the step S4', the scan target is shifted to the referenced cell (calculation cell) to scan the cell. On the other hand, when there is no referenced cell (S5': NO), the processing routine proceeds to the step S7'. In the step S7', as regards the cell scanned in the step S4', the cell is recognized as assumption datum, and the analysis on the reference structure of the analysis target index is terminated.

In step S8', a list of the initially selected index and all assumption data (numerical values) used in calculation thereof (mathematical formula) is displayed. The displayed list may be stored in the database. Then, the processing for scanning cells in the one or more spreadsheets, individually, is terminated.

Figure 7:
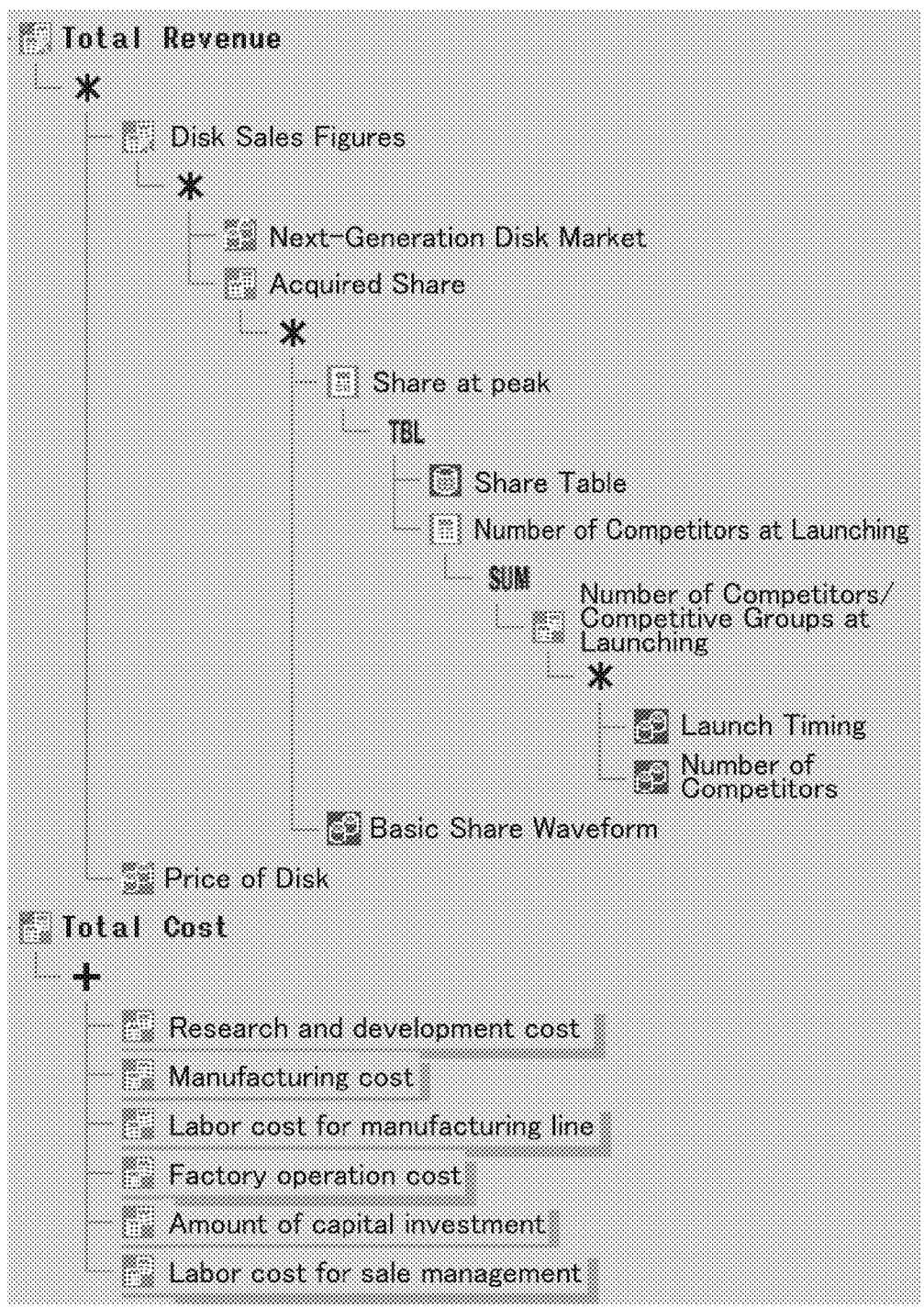
FIG. 7 is a diagram depicting a calculation structure composed of numerical values and mathematical formulas and expressed in a tree shape.

FIG. 7 is a diagram depicting a calculation structure stored in the database, wherein the calculation structure is composed of numerical values and mathematical formulas and expressed in a tree shape. The quantitative plan simulation system according to this embodiment is operable to graphically present a reference relationship among numerical values and mathematical formulas, in the form of a calculation structure composed of the numerical values and the mathematical formulas. That is, an entirety of a calculation structure necessary for an index designated as a simulation target by a user, i.e., an entirety of a cause-and-effect relationship among a plurality of pieces of assumption data regarding a result of the calculation, is graphically presented. For example, as depicted in FIG. 7, after scanning of the one or more spreadsheets, a calculation structure composed of numerical values and mathematical formulas stored in the database is expressed in a tree shape, and displayed, for example, on the Web browser of the terminal 1. Thus, the user can easily figure out a cause-and-effect relationship among a plurality of pieces of assumption data.

FIG. 8 is a diagram depicting a selection screen for selecting a goal (target) of a quantitative plan simulation. A keyword input field 103 is an input field for allowing a user to input a keyword or the like for searching data pertaining to a goal (target) of a quantitative plan simulation, from the data set stored in the database. A search button 104 is a button configured to be clicked by an input device such as a pointing device so as to perform searching. For example, when the search button 104 is clicked, the server 2 in the quantitative plan simulation system is operable to search, from the database, a data set having a name at least partially coincident with the keyword input through the keyword input field, and display a result of the search on a selection screen on the Web browser of the terminal 1, in the form of a list. As another embodiment, it is also possible to preliminarily display a list of all data sets stored in the database, on a selection screen, without displaying the keyword input field 103 and the search button 104.

For example, a list including items 105 and 106 is displayed on the selection screen. As the item 105, an index selectable as a goal of a quantitative plan simulation is displayed. Further, as the item 106, detailed information about the index displayed as the item 105 is displayed. For example, "NPV" (Net Present Value) is displayed as the item 105, and "Development Plan" and "D273" are displayed, respectively, as a spreadsheet name and a location in the spreadsheet to serve as the item 106. Similarly, "IRR" (Internal Rate of Return) and "Payout Time" are displayed at respective positions corresponding to the item 105, with former's detailed information "Sheet Name: Development Plan, Location: D351" and latter's detailed information "Sheet Name: Evaluation Summary, Location: AB5".

Figure 9:
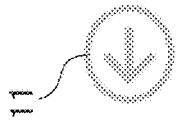
FIG. 9 is a diagram depicting an assumption adjustment screen for adjusting an assumption (input valve) constituting the selected goal (target).

A user can select an index to be set as a goal of a quantitative plan simulation, using the selection screen displayed on the Web browser as depicted in FIG. 8. For example, a link to the next screen depicted in FIG. 9 is added to each of the "NPV", "IRR" and "Payout Time" displayed as the item 105. Thus, the user can click the link by an input device such as a pointing device, so as to shift the selection screen to the next screen (see FIG. 9). Alternatively, after selecting the index displayed as the item 105, the screen may be shifted by clicking the forward arrow 10.

FIG. 9 is a diagram depicting an assumption adjustment screen for adjusting an assumption (input valve) constituting the selected goal (target), in the case where a user selects "NPV" as a goal of a quantitative plan simulation. The quantitative plan simulation system is operable to read a data set pertaining to "NPV" from the database, and carry out preparation for performing a simulation (e.g., sensitivity analysis and risk analysis (Monte Carlo simulation) as disclosed in the Non-Patent Document 1).

In the assumption adjustment screen depicted in FIG. 9, a target value field displays the selected goal (target value). In an assumption list 108, assumptions (input values) constituting the goal displayed in the target value field 107. In an example depicted in FIG. 9, "NPV" which is an index selected as the goal and "¥495" which is a value of NPV are displayed in the target value field 107, and a plurality of assumptions such as "initial market size", "market growth rate (5 years)", and "share at peak", forming "NPV" are displayed in the column "Input Value Name". In this case, the quantitative plan simulation system is operable to perform processing of: searching a data set containing a calculation result cell corresponding to "NPV" selected as the goal, from the database; reading, as assumptions (input values), the contents of the assumption data cells or calculation cells such as "initial market size", "market growth rate (5 years)" and "share at peak" contained in the searched data set; and displaying a list of the assumptions on the assumption adjustment screen. Further, in the assumption list 108, perspective current values of the input values are displayed in the column "Current Value", and slide bars for adjusting the respective values in the column "Current Value" are displayed in the column "Current Value Slide Bar".

In the assumption adjustment screen displayed on the Web browser of the terminal 1, a user can laterally displace each of the slide bars in the column "Current Value Slide Bar" to increase or reduce the current value of each of the assumptions, interlockingly with the displacement of a corresponding one of the slide bars. According to increase/decrease in the current value of each of the assumptions, the quantitative plan simulation system can dynamically perform the simulation. When the user clicks one of the assumption names in the column "Input Value Name", a detailed information display screen (FIG. 10) presenting the information about the clicked assumption is displayed.

Figure 10:
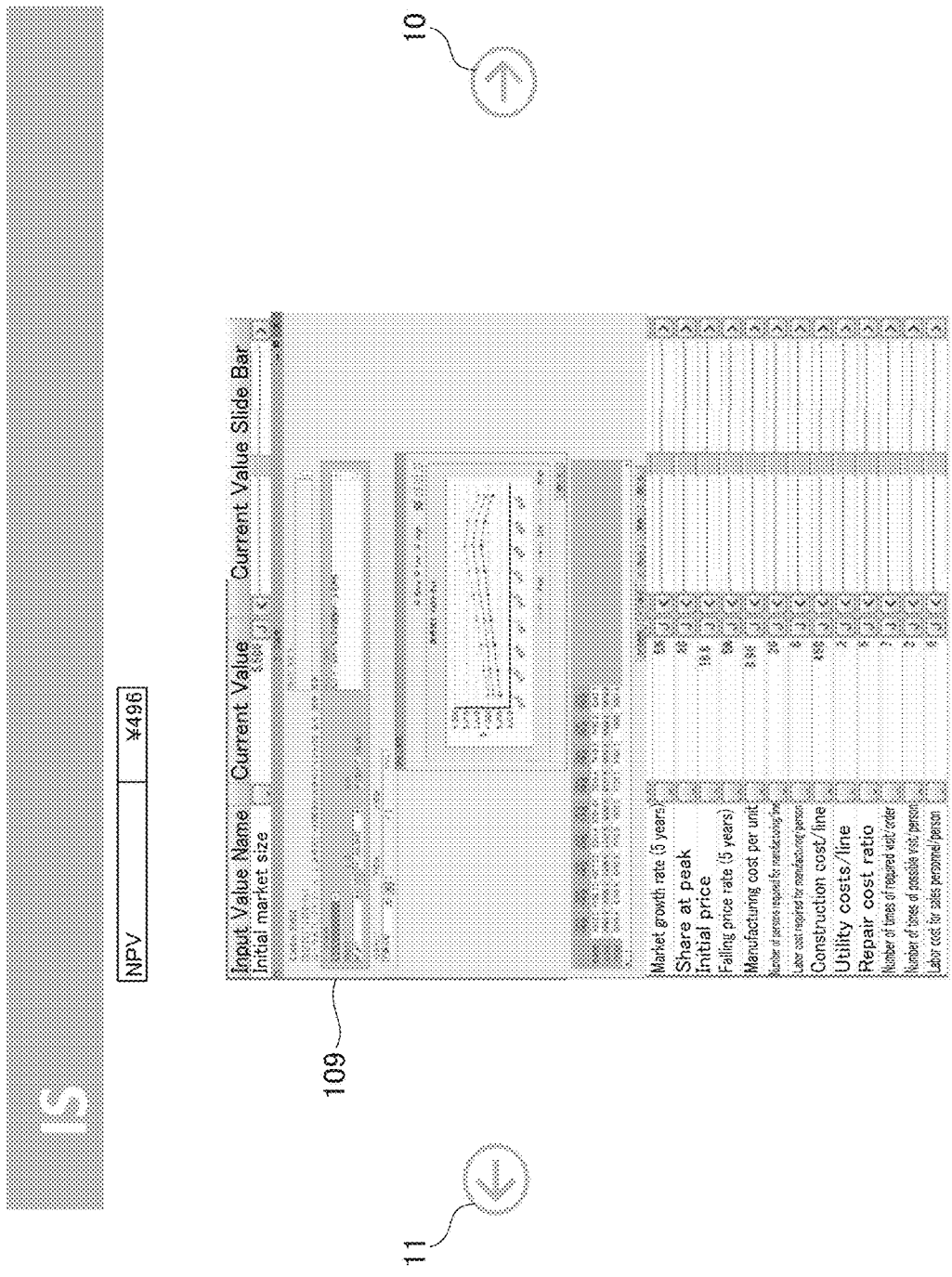
FIG. 10 is a diagram depicting a detailed information display screen for displaying information about the assumptions (input valves).

FIG. 10 is a diagram depicting the detailed information display screen displaying information about the assumptions (input values). For example, the assumption "initial market size" is clicked, a detailed information display screen 109 is inserted and displayed between the "initial market size" and the "market growth rate (5 years)" just below the "initial market size" in the assumption list 108. In the detailed information display screen 109, related information such as user's comments, time-series data or a graph can be displayed as information about the "initial market size". When the user clicks the forward arrow 10, the server 2 in the quantitative plan simulation system is operable, in response to the click input, to perform the simulation. As a result, a screen as depicted in FIG. 11 is displayed on the Web browser of the terminal 1.

Figure 11:
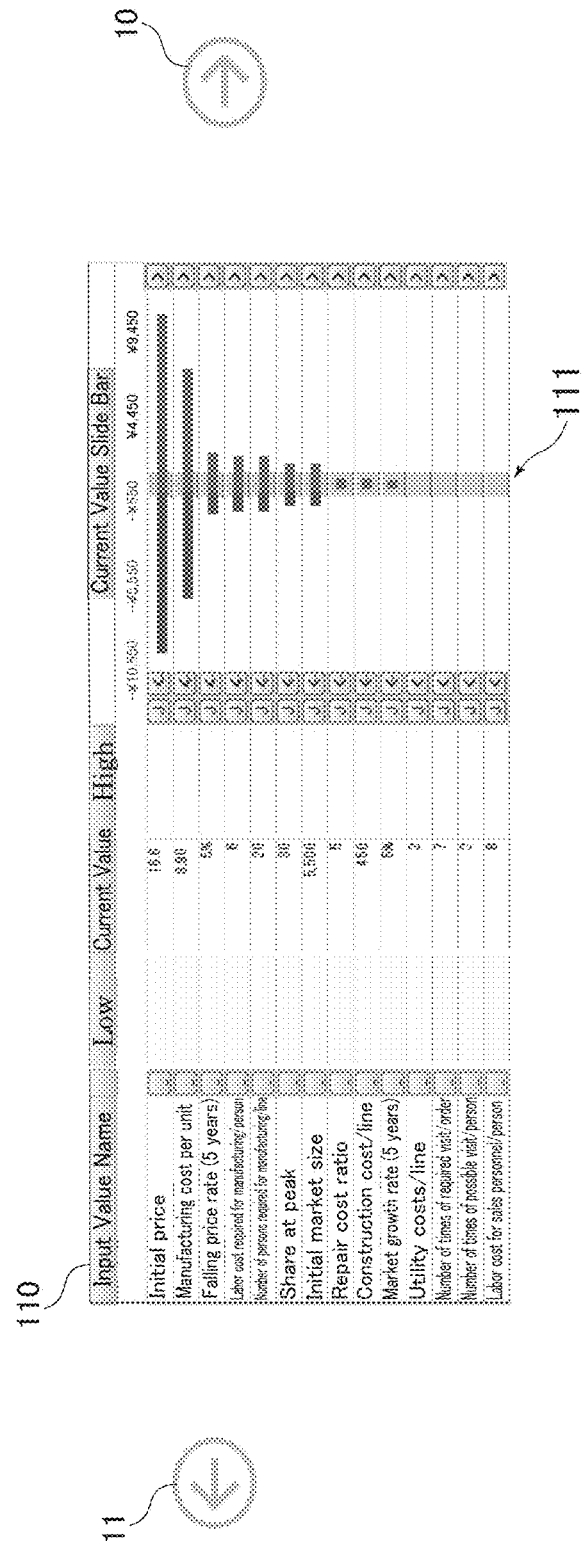
FIG. 11 is a diagram depicting a tornado chart display screen for displaying a result obtained by performing sensitivity analysis based on the assumptions (input valves) to each of which a fluctuation range is set using a preset value.

FIG. 11 is a diagram depicting a tornado chart display screen for displaying a result obtained by performing sensitivity analysis based on the assumptions (input valves) to each of which a fluctuation range is set using a preset value. The assumptions displayed in the column "Input Value Name" in an assumption list 110 are displayed after being re-arranged in descending order (or ascending order) of level of sensitivity according to a result of the sensitivity analysis. In an example depicted in FIG. 11, "initial price", "manufacturing cost per unit", "falling price rate (5 years)" and others are displayed in descending order of level of sensitivity. In the assumption list, a minimum value possibly taken by the assumption is displayed in the column "Low", and a maximum value possibly taken by the assumption is displayed in the column "High". For example, the minimum value and the maximum value each possibly taken by the assumption may be appropriately pre-set, respectively, at −20% and +20% with respect to the current value.

The minimum value and the maximum value each possibly taken by the assumption may be appropriately pre-set as mentioned above, so that it becomes possible to cutting out user's time and effort for setting of assumption data, for example, capable of, only by a click operation without modifying initial data of assumptions, allowing the user to promptly perform simulations for sensitivity analysis and risk analysis.

According to adjustment of a slide bar 111 of each of the assumptions, or according to adjustment of the minimum value (value presented in the column "Low") or the maximum value (value presented in the column "High") by means of manual input or the slide bar, the sensitivity analysis is performed in real time, and a result of the sensitivity analysis is displayed in the column "Current Value Slide Bar" of the assumption list 108 in the form of a tornado chart. In another embodiment, a tornado chart indicative of the result of the sensitivity analysis may be displayed in another column or on another screen. Further, the quantitative plan simulation system may be configured such that, when one of the slide bars 111 for the respective assumption is displaced, resulting alteration of the assumption list 110, such as re-arrangement of the assumptions in the column "Input Value Name", or a change in the target value (in this example, the value of NPV), is displayed with an animation effect. An amount of displacement of the slide bar 111 corresponding to each of the assumption is in the range of a preset minimum value (value of the "Low") and a preset maximum value (value of the "High"). In the case where at least one of the value of the "Low" and the value of the "High" is adjusted by means of manual input or the slide bar, the amount of displacement of the slide bar 111 can be altered according to the adjusted the value of the "Low" and/or the value of the "High".

Figure 12:
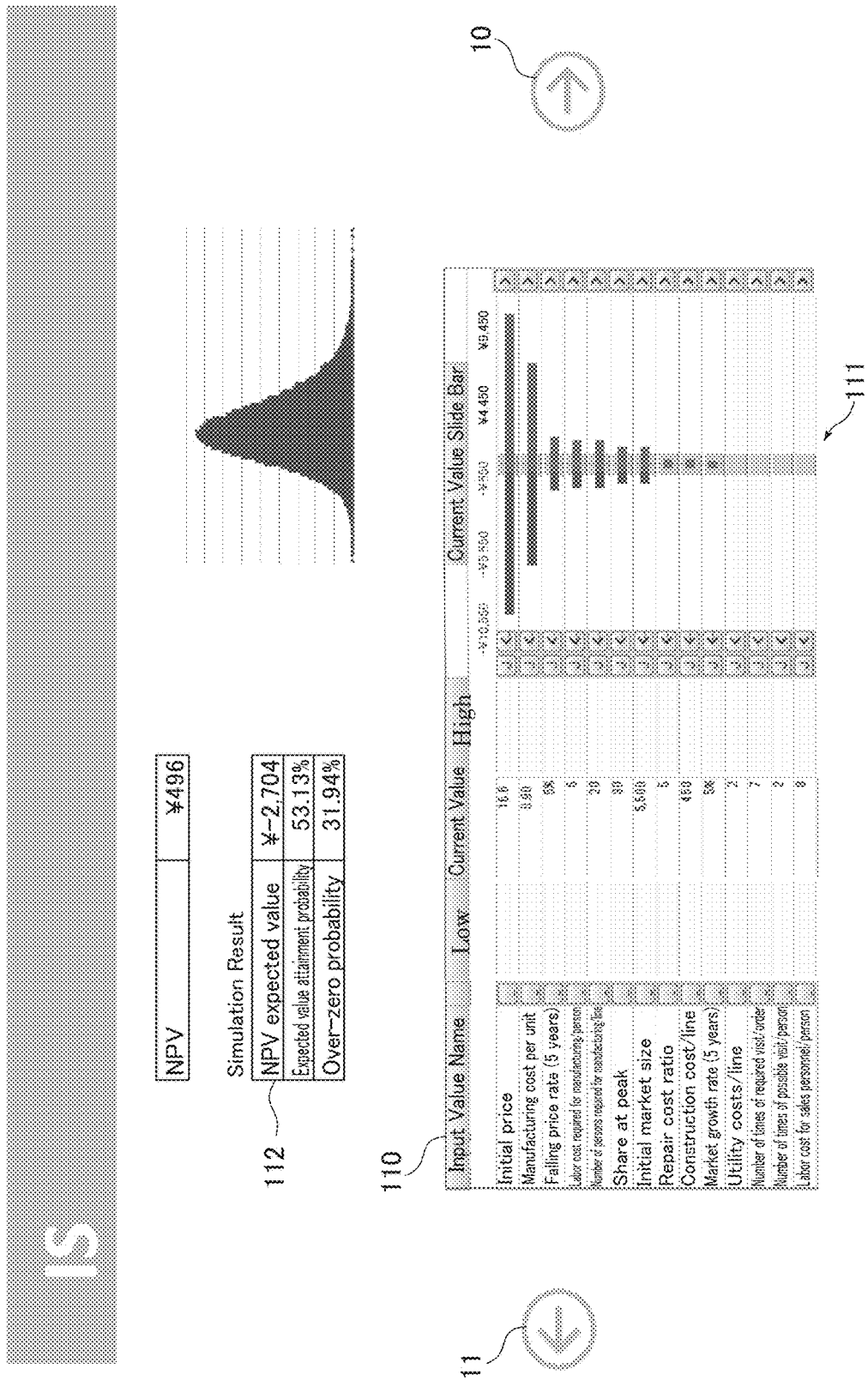
FIG. 12 is a diagram depicting a simulation result display screen for displaying a result obtained by performing risk analysis based on the assumptions (input valves).

FIG. 12 is a diagram depicting a simulation result display screen for displaying a result obtained by performing risk analysis (Monte Carlo simulation) based on the assumptions (input valves). The simulation result display screen depicted in FIG. 12 is displayed in response to clicking the forward arrow 10 in the tornado chart display screen illustrated in FIG. 11. Then, the server 2 in the quantitative plan simulation system is operable, based on the values of the assumptions (input values), to perform a Monte Carlo simulation as risk analysis. On the simulation result display screen, a probability distribution is displayed according to progression of the simulation.

In a simulation result table 112, an expected value and others obtained from a result of the Monte Carlo simulation are displayed. In the example where NPV is selected as the goal (target value), "NPV expected value", "expected value attainment probability" and "over-zero probability" are displayed together with numerical values thereof. The Monte Carlo simulation is continuously run by a constant number of times of running (e.g., 10,000 cycles or 50,000 cycles) all the time. A value of the calculation result is altered by changing the input value and the value of the "Low" or the "High" by means of the slide bar 111 or manual input. When the input value is changed, the expected value presented in the simulation result table 112 is also updated along with continuation of the running. That is, by continuously running the Monte Carlo simulation, it becomes possible to dynamically change a result of the risk analysis every time the slide bar or the like is displaced.

Further, the quantitative plan simulation system may be configured to, only by designating a file name in the input field 100 and clicking the forward arrow 10: scan all of one or more spreadsheets of a book; automatically perform a quantitative plan simulation based on scanned assumption data; and display the result depicted in FIG. 11 or FIG. 12. This makes it possible to obtain a simulation result by a one-click operation.

Based on a result of simulations such as sensitivity analysis and risk analysis (Monte Carlo simulation) depicted in FIGS. 11 and 12, the user can make a prediction about the future and easily perform decision-making.

INDUSTRIAL APPLICABILITY

The quantitative plan simulation system, method and program of the present invention are usable in the field of quantitative plan simulations for supporting planning and decision-making in management of private-sector institutions and public institutions (water projects, public transportations, other infrastructure investments, etc.)

LIST OF REFERENCE SIGNS

10: forward arrow
11: backward arrow
100: input field
102: result display field
103: keyword input field
104: search button
105: item
106: item
107: target value field
108: assumption list
109: detailed information display screen
110: assumption list
111: slide bar
112: simulation result table

The invention claimed is:

1. A simulation system, including a processor and a non-transitory memory coupled to the processor and storing instructions executable by the processor, the processor configured to repeat the steps of:

reading a file comprising one or more spreadsheets each having a plurality of cells, each of at least a part of the cells containing one of a numerical value and a mathematical formula each capable of serving as an index for a quantitative plan simulation;

selecting one of the one or more spreadsheets from the file;

scanning the cells in the selected spreadsheet; and identifying respective contents of the scanned cells, until there is no longer any spreadsheet selectable from the file, to thereby exhaustively scan all of the cells in the one or more spreadsheets, wherein, in the step of identifying respective contents of the scanned cells, the simulation system is operable: when the content of the scanned cell is a numerical value and the numerical value is used in calculation, to identify the scanned cell as an assumption data cell and then store the numerical value; when the content of the scanned cell is a numerical value and the numerical value is not used in the calculation, to identify the scanned cell as an independent numerical value cell; when the content of the scanned cell is a mathematical formula and the mathematical formula is not used in any additional calculation, to identify the scanned cell as a calculation result cell and then store the mathematical formula; and, when the content of the scanned cell is a mathematical formula and the mathematical formula is used in an additional calculation, to identify the scanned cell as a calculation cell and then store the mathematical formula, wherein the numerical values and the mathematical formulas are associated with respective pieces of information indicative of the corresponding cells each identified as any one of the assumption data cell, the calculation result cell and the calculation cell, and formed as a data set based on the calculation result cell referencing the assumption data cell, and the data set is stored in a database, together with respective names representing the numerical values and the mathematical formulas, and wherein the simulation system is operable, based on the names of the numerical values and the mathematical formulas contained in the data set stored in the database, to display, as a list of one or more candidate names, a list of respective names referencing the names of one or more indexes each capable of serving as a goal of the quantitative plan simulation, on a selection screen for allowing a user to select the goal, and further operable, when one of the one or more candidate names is selected as the goal, to: extract, from the database, the data set which contains the calculation result cell corresponding to the selected goal; read, as one or more assumptions, the contents of the one or more assumption data cells or calculation cells contained in the extracted data set; display a list of the one or more read assumptions on an assumption adjustment screen, together with a slide bar for adjusting a value of each of the one or more assumptions; and, based on the numerical values and the mathematical formulas, to perform the quantitative plan simulation by referencing the assumption cells and any adjusted assumption values using the mathematical formula in the calculation result cell that corresponds to the selected goal.

2. The simulation system as recited in claim 1, which is operable, based on the scanning of the cells in the selected spreadsheet, to count at least one of the number of scanned spreadsheets, the number of scanned cells, the number of scanned assumption data cells, the number of scanned calculation cells and the number of scanned calculation result cells, and to sequentially display the resulting counted numbers.

3. The simulation system as recited in claim 2, which is operable to graphically form and display a calculation structure composed of the numerical values and the mathematical formulas contained in the data set stored in the database, in a tree shape.

4. The simulation system as recited in claim 2, wherein
the quantitative plan simulation is continuously run, and
the value of each of the one or more assumptions is changed according to a displacement of the slide bar,
wherein the simulation system is operable to give a changed value of the assumption to the quantitative plan simulation being continuously run, as an input, to thereby obtain a result of the quantitative plan simulation in real time.

5. The simulation system as recited in claim 2, which is operable, when one of the one or more assumptions is selected, to display a detailed information display screen for presenting related information regarding the selected assumption, between an item of the selected assumption and an item of another assumption located just below the item of the selected assumption, in the displayed list.

6. The simulation system as recited in claim 1, which is operable to graphically form and display a calculation structure composed of the numerical values and the mathematical formulas contained in the data set stored in the database, in a tree shape.

7. The simulation system as recited in claim 6, wherein
the quantitative plan simulation is continuously run, and
the value of each of the one or more assumptions is changed according to a displacement of the slide bar,
wherein the simulation system is operable to give a changed value of the assumption to the quantitative plan simulation being continuously run, as an input, to thereby obtain a result of the quantitative plan simulation in real time.

8. The simulation system as recited in claim 6, which is operable, when one of the one or more assumptions is selected, to display a detailed information display screen for presenting related information regarding the selected assumption, between an item of the selected assumption and an item of another assumption located just below the item of the selected assumption, in the displayed list.

9. The simulation system as recited in claim 1, wherein
the quantitative plan simulation is continuously run, and
the value of each of the one or more assumptions is changed according to a displacement of the slide bar,
wherein the simulation system is operable to give a changed value of the assumption to the quantitative plan simulation being continuously run, as an input, to thereby obtain a result of the quantitative plan simulation in real time.

10. The simulation system as recited in claim 9, which is operable, when one of the one or more assumptions is selected, to display a detailed information display screen for presenting related information regarding the selected assumption, between an item of the selected assumption and an item of another assumption located just below the item of the selected assumption, in the displayed list.

11. The simulation system as recited in claim 1, which is operable, when one of the one or more assumptions is selected, to display a detailed information display screen for presenting related information regarding the selected assumption, between an item of the selected assumption and an item of another assumption located just below the item of the selected assumption, in the displayed list.

12. A simulation method which is performed in a simulation system, including a processor and a non-transitory memory coupled to the processor and storing instructions executable by the processor, the simulation method comprising:

a reading step, performed by the processor, of reading a file comprising one or more spreadsheets each having a plurality of cells, each of at least a part of the cells containing one of a numerical value and a mathematical formula each capable of serving as an index for a quantitative plan simulation;

a selecting step, performed by the processor, of selecting one of the one or more spreadsheets from the file;

a scanning step, performed by the processor, of scanning the cells in the selected spreadsheet; and an identifying step, performed by the processor, of identifying respective contents of the scanned cells, wherein the selecting step, the scanning step and the identifying step are repeated until there is no longer any spreadsheet selectable from the file, to thereby exhaustively scan all of the cells in the one or more spreadsheets, wherein the identifying step includes: when the content of the scanned cell is a numerical value and the numerical value is used in calculation, identifying the scanned cell as an assumption data cell and then storing the numerical value; when the content of the scanned cell is a numerical value and the numerical value is not used in the calculation, identifying the scanned cell as an independent numerical value cell; when the content of the scanned cell is a mathematical formula and the mathematical formula is not used in any additional calculation, identifying the scanned cell as a calculation result cell and then storing the mathematical formula; and, when the content of the scanned cell is a mathematical formula and the mathematical formula is used in an additional calculation, identifying the scanned cell as a calculation cell and then storing the mathematical formula, wherein the numerical values and the mathematical formulas are associated with respective pieces of information indicative of the corresponding cells each identified as any one of the assumption data cell, the calculation result cell and the calculation cell, and formed as a data set based on the calculation result cell referencing the assumption data cell, and the data set is stored in a database, together with respective names representing the numerical values and the mathematical formulas, and wherein the simulation method comprises, based on the names of the numerical values and the mathematical formulas contained in the data set stored in the database, displaying, as a list of one or more candidate names, a list of respective names referencing the names of one or more indexes each capable of serving as a goal of the quantitative plan simulation, on a selection screen for allowing a user to select the goal, and further comprises, when one of the one or more candidate names is selected as the goal: extracting, from the database, the data set which contains the calculation result cell corresponding to the selected goal; reading, as one or more assumptions, the contents of the one or more assumption data cells or calculation cells contained in the extracted data set; displaying a list of the one or more read assumptions on an assumption adjustment screen, together with a slide bar for adjusting a value of each of the one or more assumptions; and, based on the numerical values and the mathematical formulas, performing the quantitative plan simulation by referencing the assumption cells and any adjusted assumption values using the mathematical formula in the calculation result cell that corresponds to the selected goal.

13. A non-transitory computer-readable recording medium storing a program which upon execution, causes a computer to perform a procedure comprising:
    a reading step of reading a file comprising one or more spreadsheets each having a plurality of cells, each of at least a part of the cells containing one of a numerical value and a mathematical formula each capable of serving as an index for a quantitative plan simulation;
    a selecting step of selecting one of the one or more spreadsheets from the file;
    a scanning step of scanning the cells in the selected spreadsheet; and
    an identifying step of identifying respective contents of the scanned cells,
    wherein the selecting step, the scanning step and the identifying step are repeated until there is no longer any spreadsheet selectable from the file, to thereby exhaustively scan all of the cells in the one or more spreadsheets,
    wherein the identifying step includes: when the content of the scanned cell is a numerical value, and the numerical value is used in calculation, identifying the scanned cell as an assumption data cell and then storing the numerical value; when the content of the scanned cell is a numerical value and the numerical value is not used in the calculation, identifying the scanned cell as an independent numerical value cell; when the content of the scanned cell is a mathematical formula, and the mathematical formula is not used in any additional calculation, identifying the scanned cell as a calculation result cell and then storing the mathematical formula; and, when the content of the scanned cell is a mathematical formula, and the mathematical formula is used in an additional calculation, identifying the scanned cell as a calculation cell and then storing the mathematical formula,
    wherein the numerical values and the mathematical formulas are associated with respective pieces of information indicative of the corresponding cells each identified as any one of the assumption data cell, the calculation result cell and the calculation cell, and formed as a data set, based on the calculation result cell referencing the assumption data cell, and the data set is stored in a database, together with respective names representing the numerical values and the mathematical formulas, and
    wherein the procedure comprises, based on the names of the numerical values and the mathematical formulas contained in the data set stored in the database, to display, as a list of one or more candidate names, a list of respective names referencing the names of one or more indexes each capable of serving as a goal of the quantitative plan simulation, on a selection screen for allowing a user to select the goal, and further comprises, when one of the one or more candidate names is selected as the goal: extracting, from the database, the data set which contains the calculation result cell corresponding to the selected goal; reading, as one or more assumptions, the contents of the one or more assumption data cells or calculation cells contained in the extracted data set; displaying a list of the one or more read assumptions on an assumption adjustment screen, together with a slide bar for adjusting a value of each of the one or more assumptions; and, based on the numerical values and the mathematical formulas, performing the quantitative plan simulation by referencing the assumption cells and any adjusted assumption values using the mathematical formula in the calculation result cell that corresponds to the selected goal.

* * * * *